United States Patent [19]
Roy

[11] Patent Number: 6,057,027
[45] Date of Patent: May 2, 2000

[54] METHOD OF MAKING PERIPHERAL LOW INDUCTANCE INTERCONNECTS WITH REDUCED CONTAMINATION

[75] Inventor: Apurba Roy, Rockwall, Tex.

[73] Assignee: Lucent Technologies Inc., Murray Hill, N.J.

[21] Appl. No.: 09/159,733

[22] Filed: Sep. 24, 1998

[51] Int. Cl.$^7$ .................................. B05D 5/12; B32B 3/00
[52] U.S. Cl. ........................... 428/209; 427/98; 427/307; 427/357; 427/97; 428/901
[58] Field of Search ................... 427/97, 98, 357, 427/307; 428/901, 209

[56] References Cited

U.S. PATENT DOCUMENTS

| | | | |
|---|---|---|---|
| 4,183,137 | 1/1980 | Lomerson | 427/97 |
| 4,521,262 | 6/1985 | Pellegrino | 427/97 |
| 4,605,471 | 8/1986 | Mitchell | 427/97 |
| 4,784,104 | 11/1988 | Ferrier et al. | 427/98 |
| 5,985,521 | 11/1999 | Hirano et al. | 427/97 |

OTHER PUBLICATIONS

Lynch et al., Rigid Printed Wiring Board Fabrication Techniques, Electronic Materials Handbook, vol. 1, pp. 539–549 (no date).

*Primary Examiner*—Shrive Beck
*Assistant Examiner*—Paul D. Strain

[57] ABSTRACT

A method for making a circuit device having at least one peripheral interconnect for electrically connecting the device to another circuit device on a motherboard, includes forming at least one opening in a substrate, the opening having an inner surface extending between first and second major surfaces of the substrate. The inner surface of the opening and portions of the major surfaces adjacent the opening are coated with electrically conductive material. Electrically conductive material is removed from opposing regions of the inner surface of the opening prior to plating and then, after plating, the substrate is cut in a line extending across opposing regions to expose the coated and plated inner surface as the peripheral electrical interconnect. The method produces interconnects with reduced contamination by conductive particulates.

13 Claims, 5 Drawing Sheets

6,057,027

METHOD OF MAKING PERIPHERAL LOW INDUCTANCE INTERCONNECTS WITH REDUCED CONTAMINATION

FIELD OF THE INVENTION

This invention relates to methods of making circuit devices with peripheral low inductance interconnects, and in particular, to a method for making such interconnects with reduced contamination by conductive particulates. The method is particularly useful in making printed wiring board devices (PWBs).

BACKGROUND OF THE INVENTION

Circuit devices are used in a vast assortment of equipment including computers and communication systems. Many circuit devices include dense and complex arrays of electronic, magnetic, and/or electromagnetic circuit components such as capacitors, resistors, integrated circuit chips (ICs), inductors, and lens systems, mounted on a printed wiring board (PWB). The PWB mechanically supports the circuit components and electrically interconnects them.

PWBs also provide means for electrically interconnecting the devices to electrical power, ground and other circuit devices mounted on a motherboard. Such means typically comprise electrical interconnect structures which can include separately attached connectors or interconnects built directly into the PWB or motherboard.

Conventional electrical interconnects used for interconnecting circuit devices such as high-speed microprocessors and power supplies may produce undesirable switching transients, especially if large currents must be switched and delivered to the microprocessor in a high-speed manner. In such cases, the presence of even small inductances in the interconnection path can generate significant spurious voltage signals. Such signals can deleteriously affect the performance of the microprocessor. Lowering the inductance in the interconnection path reduces the magnitude of the spurious or transient signals. Accordingly, low-inductance interconnects are essential for assuring the performance of the microprocessor.

Electrical interconnects with appropriately low-inductance have been developed for such circuit devices. These interconnects are formed in the edge surface of the PWB and typically comprise thin layers of copper (Cu). The interconnects are formed by routing or cutting through specially metallized regions of the PWB during PWB manufacture. Routing produces metal burrs in the metallized regions which must be removed by de-burring the PWB.

Unfortunately, deburring can contaminate the PWB circuitry with metal debris and compromise the various coatings on the PWB. Additionally, electrical interconnects for high-current circuit devices are made with thicker layers of metal than interconnects for low-current devices and thus, have more severe burring/deburring problems.

Accordingly, a need exists for an improved method of making a circuit device with ultra-low inductance electrical interconnects.

SUMMARY

A method for making a circuit device having at least one peripheral interconnect for electrically connecting the device to another circuit device on a motherboard. The method comprises forming at least one opening in a substrate and coating the inner surface of the opening and portions of major surfaces of the substrate adjacent the opening with electrically conductive material. Electrically conductive material is removed from opposing regions of the inner surface of the opening prior to plating and then, after plating, the substrate is cut in a line extending across opposing regions to expose the coated and plated inner surface as the peripheral electrical interconnect.

BRIEF DESCRIPTION OF THE DRAWINGS

The advantages, nature and various additional features of the invention will appear more fully upon consideration of the illustrative embodiments now to be described in detail in connection with the accompanying drawings wherein.

It is to be understood that these drawings are for purposes of illustrating the concepts of the invention and, except for graphical illustrations, are not to scale.

DETAILED DESCRIPTION OF THE INVENTION

Figure 1:
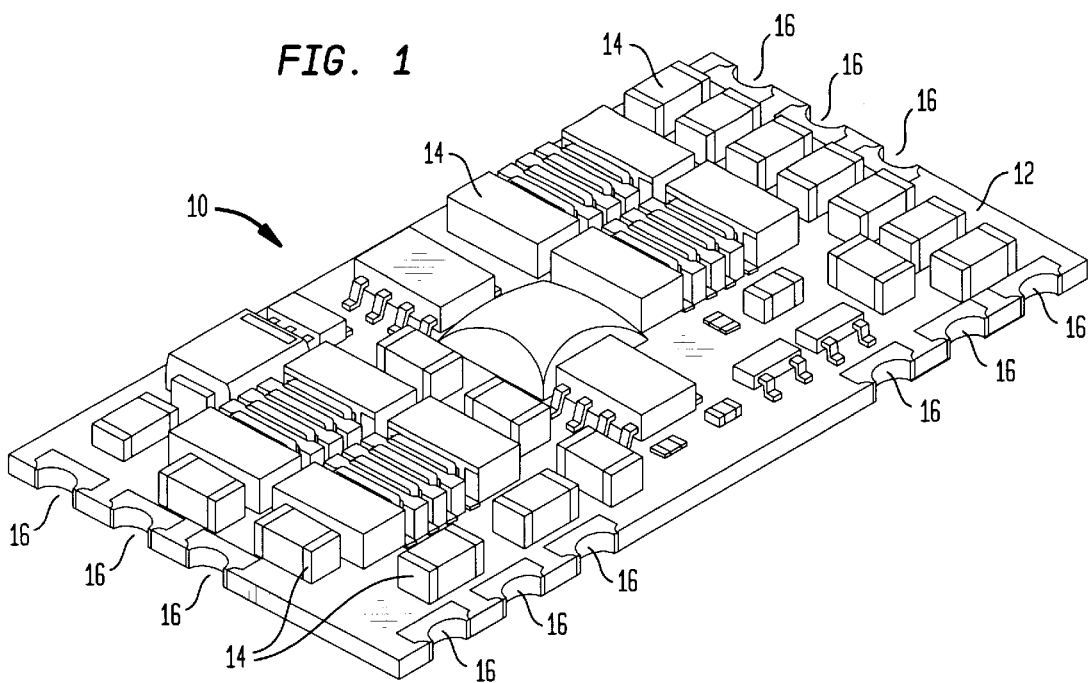
FIG. 1 is a perspective view of a circuit device having a plurality of ultra-low inductance electrical interconnects.

FIG. 1 illustrates a circuit device 10 having a plurality of ultra-low inductance electrical interconnects 16. The circuit device 10 comprises a printed wiring board 12 (PWB) with circuit components 14 mounted thereon and the electrical interconnects 16 disposed along the edge surfaces of the PWB 12. The interconnects 16 are especially useful for power module circuit devices and power hybrid package circuit devices requiring low-inductance electrical interconnection paths to associated circuit devices on a motherboard. The ultra-low interconnects 16 may also be used in other applications where low-inductance electrical interconnection paths are required.

Figure 2A:
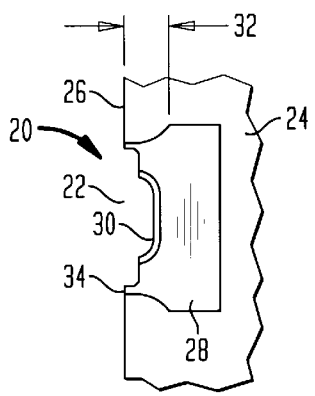
FIG. 2A is a plan view of an ultra-low inductance electrical interconnect which is similar to the interconnects depicted in FIG. 1.
Figure 2B:
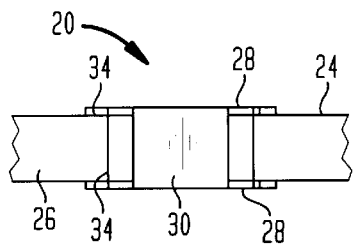
FIG. 2B is an elevational view of the interconnect of FIG. 2A.

FIGS. 2A and 2B show an ultra-low inductance electrical interconnect 20 similar to the electrical interconnects depicted in FIG. 1. The interconnect 20 comprises a stepped recess 22 defined in the edge surface 26 of a double-sided PWB 24, electrically conductive metallic plates 28 (horizontal plates 28) extending from the stepped recess 22 on at least the upper and lower surfaces of the PWB 24 and an electrically conductive metallic plate 30 (vertical plate 30) extending between the horizontal plates 28 along a surface of the stepped recess 22. Each horizontal plate 28 has a narrowed region 32 that tapers inwardly toward the stepped recess 22. The narrowmost portion 34 of the narrowed region 32 of each horizontal plate 28 extends slightly beyond the stepped recess 22 along the edge of the PWB 24.

The metallic plates 28, 30 of the interconnect 20 typically comprise copper (Cu). The metallic plates of low current interconnects typically comprise about 0.5–1.0 ounces of Cu (about 0.69–1.38 mils thick) and the plates of high current interconnects typically comprise about 2–4 ounces of Cu (about 2.8–5.5 mils thick).

Figure 3A:
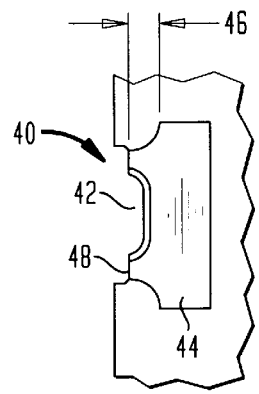
FIG. 3A is a plan view of a second type of ultra-low interconnect.
Figure 3B:
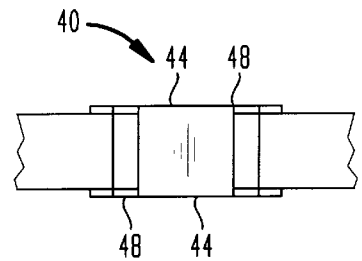
FIG. 3B is an elevational view of the interconnect of FIG. 3A.

FIGS. 3A and 3B show a second type of ultra-low inductance electrical interconnect 40. This interconnect 40 is substantially similar to the interconnect 20 described with respect to FIGS. 2A and 2B. However, the narrowmost portion 48 of the horizontal plate's 44 narrowed region 46 does not extend beyond the stepped recess 42.

FIGS. 4A–4G illustrate a process for forming circuit devices with ultra-low inductance electrical interconnects similar to the interconnects shown in FIGS. 2A and 2B.

Figure 4A:
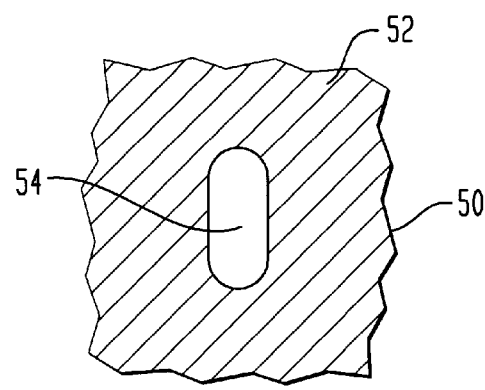
FIGS. 4A, 4B, 4C, 4D, 4E, 4F, and 4G are plan views of a segment of a PWB illustrating a process for forming a circuit device having an ultra-low inductance electrical interconnect similar to the electrical interconnect shown in FIGS. 2A and 2B.

In the first step of the process shown in FIG. 4A, a double-sided PWB 50 coated with a metallic flash 52, is drilled and deburred to provide one or more holes or vias 54 (only one shown). The hole 54 can be elongated as shown, or circular. The hole 54 extends entirely through the PWB 50 and can be formed with a suitable drilling and deburring apparatus. The metallic flash 52 typically comprises a thin layer of Cu.

Figure 4B:
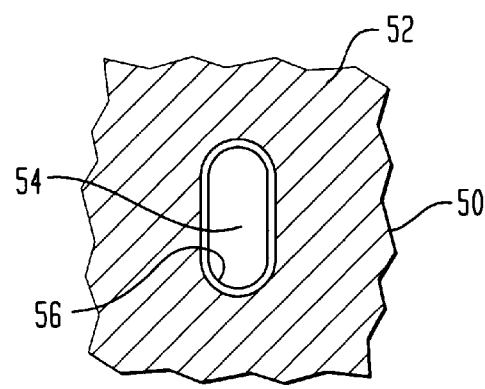

FIG. 4B shows the PWB 50 after the inner surface of the elongated hole 54 has been coated with a metallic flash 56. This metallic flash 56 can be a thin layer of Cu or other metal. The metallic flash 56 is typically applied to the surface of the elongated hole 54 by an electroless plating bath, by sputtering, or by chemical vapor deposition.

Figure 4C:
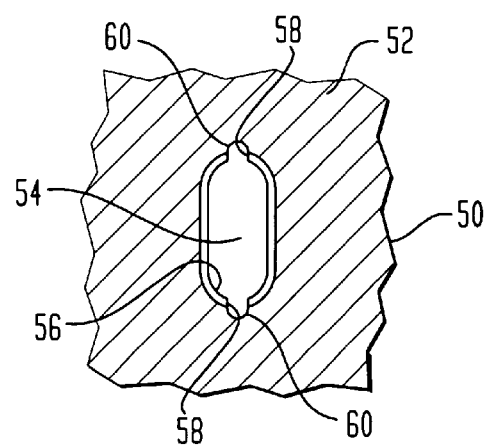

The next step of the process shown in FIG. 4C comprises notching or "pre-routing" the ends of the elongated hole 54 to provide the hole with opposing notches 60. The notches 60 provide the hole 54 with inner surface portions 58 that are not coated with the metallic flash 56. (The notches 60 and the elongated hole 54 define the stepped recess portion of the interconnect.) Because the inner surfaces 58 of the notches 60 have no metallic flash, metallic material buildup in this region is advantageously prevented during subsequent interconnect processing. Pre-routing can be accomplished with a suitable routing apparatus.

Figure 4D:
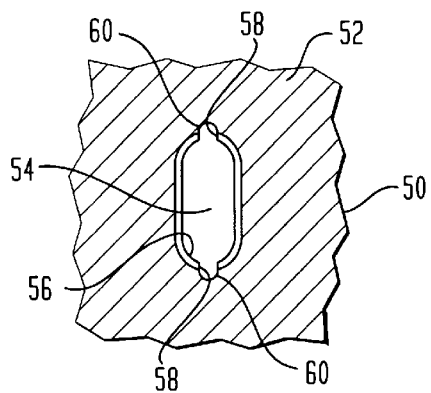

FIG. 4D shows the PWB 50 after increasing the thickness of the metallic flash 56, 52 respectively coating the elongated hole 54 and the surfaces of the PWB 50. This is typically accomplished by electrolytically plating the PWB 50.

Figure 4E:
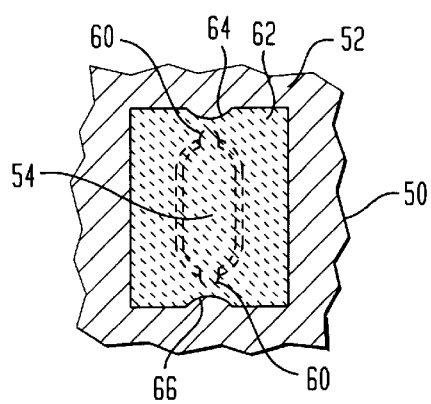

An etch mask 62 is formed over the elongated hole 54 in the fifth step of the process as shown in FIG. 4E. The etch mask 62 tapers toward the notches 60 of the hole 54 at locations denoted by numerals 64 and 66 to minimize or restrict the area of metallization 52 covered in these regions while providing adequate "tenting" for future etching. The etch mask 62 typically comprises a patterned layer of photoresist. The photoresist layer is about 2.7 mils thick and can be formed using conventional photolithography.

Figure 4F:
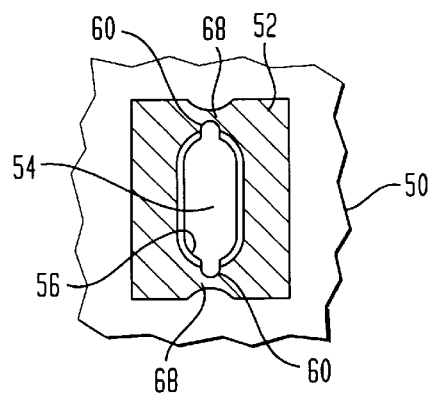

FIG. 4F shows the PWB 50 after etching the unmasked portions of the metallic layer 52 and stripping away the etch mask 62. This step is typically performed using conventional metal etching and resist removal processes. Narrow strips 68 of metallization remain adjacent the notches 60 of the hole 54.

Figure 4G:
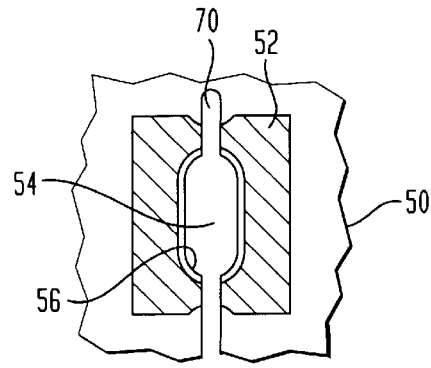

The circuit device and the interconnect are finalized in the step shown in FIG. 4G which comprises applying a soldermask, cutting or routing the PWB 50 along a routing path 70 that extends through the notches 60 and the narrow metallization strips 68, and mounting circuit components (not shown) on the PWB 50. Because the routing path 70 extends through the notches 60 and the narrow strips 68 of metallization, burring is minimized. In particular, virtually no burring occurs in the region defined by the notches 60 and burring is minimized in the cut-through region of the narrow metallization strips 68. Accordingly, subsequent deburring operations are advantageously minimized.

FIGS. 5A–5G illustrate a process for forming a circuit device having an ultra-low inductance electrical interconnect similar to the electrical interconnect shown in FIGS. 3A and 3B. This process can also produce a circuit device having multiple ultra-low inductance electrical interconnects.

Figure 5A:
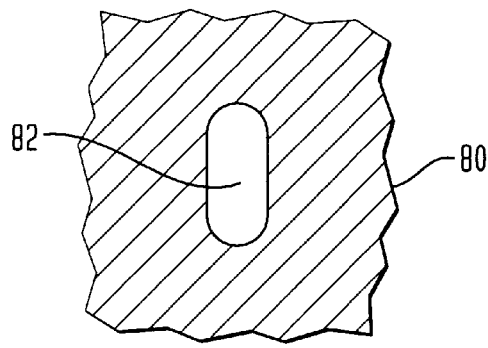
FIGS. 5A, 5B, 5C, 5D, 5E, 5F, and 5G are plan views of a segment of a PWB illustrating a second process for forming a circuit device having an ultra-low inductance electrical interconnect similar to the electrical interconnect shown in FIGS. 3A and 3B.

The process starts off with an uncoated double-sided PWB 80. In FIG. 5A, the uncoated PWB 80 is drilled and deburred to provide an elongated hole 82.

Figure 5B:
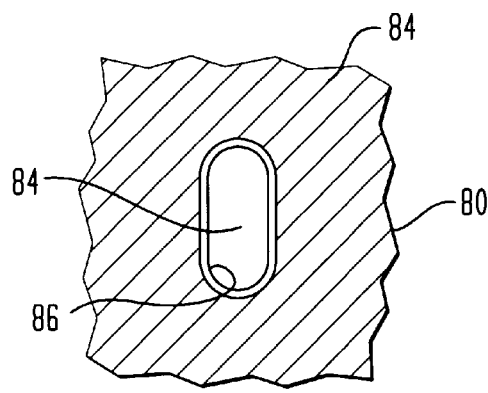

In the second step of the process shown in FIG. 5B, the inner surface of the elongated hole 82 and the surfaces of the PWB 80 are coated with a metallic flash 86, 84 such as Cu. This step can be performed using electroless plating, sputtering, or CVD.

Figure 5C:
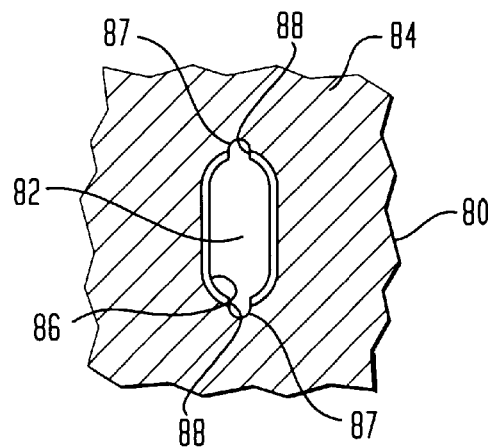

The next step of the process shown in FIG. 5C, comprises notching or pre-routing the ends of the elongated hole 82 to provide notches 87 with inner surface portions 88 that are not coated with the metallic flash. This process step is substantially similar to the process step of FIG. 4C.

Figure 5D:
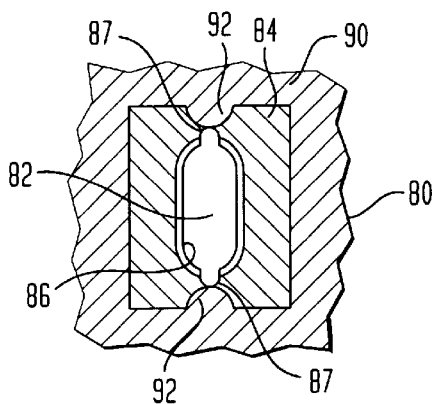

FIG. 5D shows a mask layer 90 of photoresist formed partially over each surface of the PWB 80. The mask layer 90 includes two projections 92 which extend toward the edges of the notches 87.

Figure 5E:
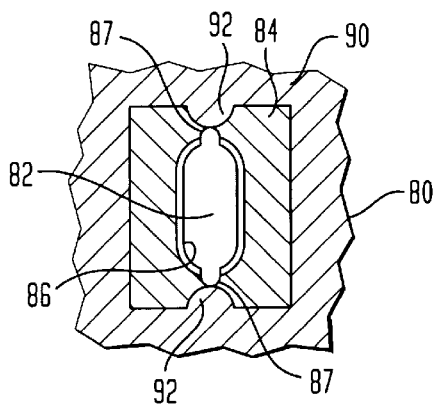

In FIG. 5E, the thickness of the metallic flash 82, 86 covering the unmasked surfaces of the PWB 80 and the inner surface of the elongated hole 84 is increased by electrolytically plating (with Cu) and solder/tin plating the PWB 80. The projections 92 of the mask layer 90 prevent plating material from being deposited adjacent the ends of the notches 87. Note that no plating takes place in region 88.

Figure 5F:
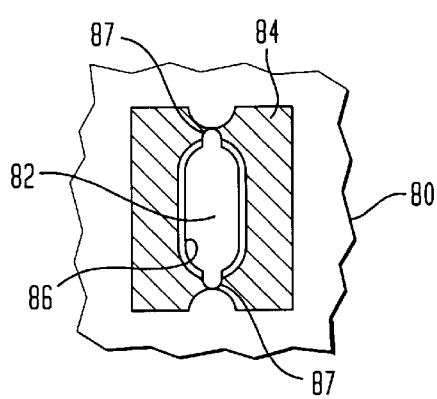

FIG. 5F shows the PWB 80 after stripping away the mask layer 90 and then etching the PWB 80 to remove the unplated portions of the metallic flash 86 (the solder/tin plating resists the etching). As shown, no metallic material remains at the ends of the notches 87.

Figure 5G:
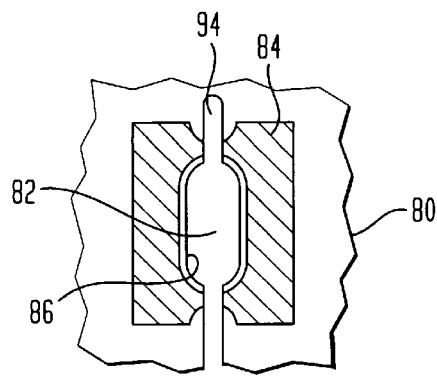

The final step of the process shown in FIG. 5G comprises applying a soldermask, cutting or routing the PWB along a routing path 94 that extends through the notches 87, and mounting circuit components (not shown) to the PWB 80 to finalize the circuit device and the structure of the interconnect. The routing path 94 does not extend through any metallization. Accordingly, subsequent deburring operations are minimized or eliminated because substantially no burrs are created during this step.

It can now be seen that the improved method of making a circuit device having one or more peripheral electrical interconnects modifies conventional processes. An important modification is that the flash coating of the opening inner surface is removed from at least two regions of the inner surface before plating. The removal can be affected by removing portions of the substrate adjacent the opening, as by routing. This removal prevents plating on the regions, and this eliminates cutting of conductive material when the substrate is cut to expose the plated portions of the inner surface.

It can also be seen that in relation to the direction of cutting (across the opening between the regions of removed coating) there are advantageous dimensional relations. If transverse to the cutting direction, the opening has a dimension $d_1$, the maximum dimension regions of the removed coating have a dimension of $d_2$, and the width of cutting has a dimension $d_3$, then $d_3$ should be less than $d_2$, and $d_3$ should be less than $d_1$. $d_2$ is not necessarily less than $d_1$.

The improved method can be applied to insulating substrates, to insulating substrates having conductive layers on one or both major surfaces, and to multilayer substrates comprising plural insulating layers sandwiching one or more internal conductive layers. Preferably the internal conductive layers are patterned so that they do not cross the line of cutting.

The flash coating is typically electroless coated to a thickness less than about 10 micrometers and plating is typically electrolytic plating to a thickness greater than about 20 micrometers. Copper is the preferred conductive material.

While the foregoing invention has been described with reference to the above embodiments, various modifications and changes may be made without departing from the spirit of the present invention. Accordingly, modifications and changes such as those suggested above but not limited thereto are considered to be within the scope of the claims.

What is claimed is:

1. In the method of making a circuit device including at least one peripheral electrical interconnect comprising the steps of a) providing a planar substrate having first and second major surfaces, b) forming in the substrate an opening having an opening inner surface extending between the first and second major surfaces, c) applying to the opening inner surface a flash coating of electrically conductive material, d) plating additional conductive material in the opening, e) cutting across the opening to expose the plated inner surface as the peripheral electrical interconnect;

the improvement wherein:

after flash coating the opening inner surface and before plating, flash coating is removed from at least two regions of the inner surface to prevent plating on said regions; and the cutting across the opening extends between the two regions of coating removal to reduce the cutting of conductive material.

2. The method of claim 1 wherein the flash coating is removed from the inner surface by removing portions of the substrate adjacent the opening.

3. The method of claim 1 wherein the flash coating is removed from the inner surface by routing portions of the substrate adjacent the opening.

4. The method of claim 1 wherein the cutting across the opening is by routing.

5. The method of claim 1 wherein transverse to the direction of cutting across the opening, the opening has a dimension $d_1$, the maximum dimension of the removed coating has a dimension of $d_2$, and the width of cutting has a dimension $d_3$, wherein $d_3$ is less than $d_2$, and $d_3$ is less than $d_1$.

6. The method of claim 1 wherein the flash coating comprises copper.

7. The method of claim 1 wherein the plated conductive material comprises copper.

8. The method of claim 1 wherein providing the substrate comprises providing an insulating substrate.

9. The method of claim 1 wherein providing the substrate comprises providing an insulating substrate including a layer of conductive material on at least one major surface.

10. The method of claim 1 wherein providing the substrate comprises providing a multilayer substrate comprising a plurality of insulating layers and one or more internal layers of conductive material.

11. The method of claim 1 including the step of connecting the circuit device to another circuit device through the peripheral electrical interconnect.

12. A method for making a circuit device having at least one peripheral interconnect for electrically connecting the device to another circuit device, the method comprising the steps of:

providing a planar substrate having first and second major surfaces;

forming at least one opening in the substrate, the opening having an inner surface extending between the first and second major surfaces;

coating the inner surface of the opening and portions of the major surfaces adjacent the opening with electrically conductive material;

removing the electrically conductive material from opposing regions of the inner surface of the opening;

after said removing, plating additional conductive material in the opening; and cutting the substrate in a line extending across opposing regions to expose the plated inner surface as the peripheral electrical interconnect.

13. A circuit device comprising a peripheral interconnect made by the process of claim 1.

* * * * *